US005107186A

United States Patent [19]

Ihara

[11] Patent Number: 5,107,186

[45] Date of Patent: Apr. 21, 1992

[54] CONVERTER AND DISCHARGE-LAMP OPERATING APPARATUS USING THE CONVERTER

[75] Inventor: Akihiko Ihara, Shizuoka, Japan

[73] Assignee: Olympus Optical Co., Ltd., Tokyo, Japan

[21] Appl. No.: 624,191

[22] Filed: Dec. 6, 1990

[30] Foreign Application Priority Data

Dec. 12, 1989 [JP] Japan ............................ 1-143402[U]
Dec. 12, 1989 [JP] Japan ................................ 1-322274

[51] Int. Cl.$^5$ ............................................ H05K 5/00

[52] U.S. Cl. ................................... 315/276; 361/377; 336/90; 174/DIG 2

[58] Field of Search ......................... 315/276, DIG. 5; 361/377; 336/90; 174/DIG. 2

[56] References Cited

U.S. PATENT DOCUMENTS 3,655,906 4/1972 Robb ....................... 174/DIG. 2 X
4,916,363 4/1990 Burton et al. ........... 174/DIG. 2 X

FOREIGN PATENT DOCUMENTS 61-171199 10/1986 Japan .
0252917 11/1987 Japan .................................... 336/90

*Primary Examiner*—Robert J. Pascal
*Attorney, Agent, or Firm*—Frishauf, Holtz, Goodman & Woodward

[57] ABSTRACT

A discharge-lamp operating apparatus used for operating a discharge lamp includes an outer case having high thermal conductivity and a printed circuit board housed in the case and provided with a discharge-lamp operating circuit including an electromagnetic equipment with a core and a switching element. The electromagnetic equipment is inserted into an opening formed in a part of the circuit board so that the equipment is attached to the circuit board, and the switching element is arranged on the circuit board with it being separated from the equipment so that it is prevented from being influenced by heat generated from the equipment and has a heat radiating member being in face-contact with at least one of the inner surfaces of the case.

17 Claims, 6 Drawing Sheets

CONVERTER AND DISCHARGE-LAMP OPERATING APPARATUS USING THE CONVERTER

BACKGROUND OF THE INVENTION

1. Field of the Invention

The present invention relates to a converter and a discharge-lamp operating apparatus using the converter used to operate a discharge lamp.

2. Description of the Related Art

FIGS. 1 and 2 schematically show a discharge-lamp operating apparatus according to the prior art to operate such discharge lamp as a fluorescent lamp.

The outer case 10 of the conventional discharge-lamp operating apparatus is made of metal, which is constructed by detachably combining the upper case member 12 and the lower case member 14 so that they form an approximately-square tube.

On the inner surface of the lower wall of the lower case member 14, several supporting posts 16, which are cut out from the lower wall and bent inwardly, are arranged.

The printed circuit board 18 is supported along the inner surface of the lower wall by these supporting posts 16 so that the board 18 is separated from the inner surface. The transformer 20 as a magnetic equipment having a core, the switching element 22 comprising such as transistors, and other various electronic parts 24 are installed on the upper surface of the printed circuit board 18. The predetermined wiring patterns are printed on the lower surface of the printed circuit board 18.

The transformer 20, the switching element 22, and other various electronic parts 24 are passed at their downwardly orientated terminals through several through-holes formed at the predetermined positions on the printed circuit board 18, and are secured to the printed circuit board 18 by soldering the downward ends of the terminals to the predetermined positions of the wiring patterns on the lower surface of the printed circuit board 18, so that they comprise a discharge-lamp operating circuit.

The insulating paper 26 is attached to the inner surface of the lower wall of the lower case member 14 in order to assure electrical insulation between the inner surface and the wiring patterns on the lower surface of the printed circuit board 18 arranged closely to the inner surface.

Assurance of electrical insulation between the upper case member 12 and the transformer 20, switching element 22, and other various electronic parts 24 on the upper surface of the printed circuit board 18 is achieved by keeping the distance between them at a predetermined value or more.

The longitudinal ends of the printed circuit board 18 extend beyond the range covered with the upper wall of the upper case member 12. The input terminal block 28 having several terminals 28a for inputting to the discharge lamp operating circuit from a power source (not illustrated) is secured to one of the ends of the printed circuit board 18, and the output terminal block 30 having several terminals for outputting to a fluorescent lamp (not illustrated) form the discharge-lamp operating circuit is secured to the other of the both ends.

In the conventional discharge-lamp operating apparatus configured as mentioned above, the outer case 10 has a large height because the upper wall of the upper case member 12 must be located above the transformer 20, switching element 22, and other various electronic parts 24 on the upper surface of the printed circuit board 18 for a predetermined distance or more in order to assure electrical insulation.

In addition, in order to prevent various electronic parts 24 from being malfunctioned by heat generated from the transformer 20 and switching element 22 while the discharge-lamp operating apparatus is operating, the above-mentioned conventional discharge-lamp operating apparatus has to use the large transformer 20, switching element 22, and various electronic parts 24, each having large heat capacity.

Thus, the above reason causes the height of the outer case 10 to increase and prevents the price of the discharge-lamp operating apparatus from decreasing.

Therefore, it is difficult to decrease the thickness of the luminaire using the above-mentioned conventional discharge-lamp operating apparatus and decrease the price of the luminaire.

Moreover, the above-mentioned conventional discharge-lamp operating apparatus has relatively large natural-oscillation length of the printed circuit board 18 because the printed circuit board 18 is supported to the inner surface of the lower wall of the lower case member 14 by only several supporting posts 16 formed on the lower wall of the lower case member 14. Therefore, beats, generated in the printed circuit board 18 by the vibration generated from the transformer 20 while the discharge-lamp operating apparatus is operating, are easily increased.

SUMMARY OF THE INVENTION

The present invention is made under the above situation, and the main object of the invention are to provide converters and discharge-lamp operating apparatuses using the converter which are inexpensive and make an apparatus, such as a discharge-lamp operating apparatus using the converter, compact, especially to decrease the height of the apparatus.

The present invention not only achieves the above described main object but provides converters which can effectively suppress beats generated in a printed circuit board and discharge-lamp operating apparatuses using the converter.

To achieve the above mentioned object of the present invention, the converter according to the present invention comprises an outer case having high thermal conductivity, and a printed circuit board housed in the outer case and being provided with the converter circuit including electromagnetic equipment having a core. An opening into which electromagnetic equipment is inserted is formed on a part of the printed circuit board, and the core of the electromagnetic equipment inserted into the opening of the printed circuit board is in face-contact with at least one of the inner surfaces of the outer case.

In the above-mentioned converter according to the present invention, the outer case has high thermal conductivity, the opening into which electromagnetic equipment is inserted is formed on a part of the printed circuit board, and the core of the electromagnetic equipment inserted into the opening of the printed circuit board is in face-contact with at least one of the inner surfaces of the outer case. Though the electromagnetic equipment having a core has a large calorie power, the large amount of heat generated from the electromagnetic equipment can quickly be transferred to the outside of the outer case through the outer case by face-contacting the core with at least one of the inner surfaces of the outer case having high thermal conductivity.

The height of the outer case can be decreased by so constructing the outer case that at least one of the inner surfaces of the case is in face-contact with the core of the electromagnetic equipment. Moreover, as mentioned above, since the heat discharge efficiency of the electromagnetic equipment is increased so that the electromagnetic equipment and other electronic parts comparatively weak in heat on the printed circuit board can be changed to those with heat capacity smaller than ever, the price of the converter can be lowered.

By inserting the core of the electromagnetic equipment which is the highest among various electric or electronic parts arranged on the printed circuit board into the opening of the printed circuit board and making the core in face-contact with at least on of the inner surfaces of the outer case, it is possible to ensure a space for electrical insulation between the remaining electric or electronic parts on the both surfaces of the printed circuit board and the inner surface of the outer case.

If necessary, as a matter of course, electrical insulating member can be installed on the inner surface of the outer case.

By face-contacting the core of the electromagnetic-equipment inserted into the opening of the printed circuit board with at least one of the inner surfaces of the outer case, the printed circuit board is supported by the outer case through the core of the electromagnetic equipment. Therefore, it is possible to shorten the natural-oscillation length of the printed circuit board and then to decrease the beats generated in the printed circuit board by the electromagnetic equipment during the operation of the converter.

To achieve the above-mentioned object of the present invention; the discharge-lamp operating apparatus according to the present invention and used to operate a discharge lamp comprises an outer case having high thermal conductivity, and a printed circuit board housed in the outer case and being provided with a discharge-lamp operating circuit including electromagnetic equipment with a core and a switching element, wherein the electromagnetic equipment is attached to the printed circuit board by the core being inserted into an opening formed in a part of the printed circuit board, and the switching element is arranged on the printed circuit board with it being separated from the electromagnetic equipment in order to prevent it from being influenced by heat generated from the electromagnetic equipment and has a heat radiating member being in face-contact with the inner surface of the outer case.

This discharge-lamp operating apparatus comprises an electromagnetic equipment having a core, which construct a converter, in addition to the above-mentioned feature of the converter according to the present invention, and further comprises a switching element arranged on a printed circuit board with it being separated from the electromagnetic equipment in order to prevent it from being influenced by the heat generated from the electromagnetic equipment, and having a heat radiating member face-contacting the inner surface of an outer case.

According to the above construction, even a switching element especially weak in heat, together with electromagnetic equipment, can be housed in an outer case, made more compact and smaller in height compared with the conventional one.

Moreover, because the heat radiating member of the switching device is in face-contact with the inner sur face of the outer case, the heat radiating member can be used for not only radiating heat from the switching element to the outer case but also supporting the printed circuit board to the outer case. Therefore, compared with the converter according to the above described present invention, the natural vibration length of the printed circuit board can further be decreased and beats generated in the printed circuit board by electromagnetic equipment during the operation of the discharge-lamp operating apparatus can further be suppressed.

In the converter and the discharge-lamp operating apparatus using the converter both of which are constructed as mentioned above and according to the present invention, it is preferable that the core of the electromagnetic equipment is in face-contact with two facing portions of the inner surfaces of the outer case, which face each other.

The height of the outer case can surely be decreased by using the upper add lower walls of the outer-case inner surface as the two facing portions of the inner surfaces of the outer case.

Also, in the converter and the discharge-lamp operating apparatus using the converter both of which are constructed as mentioned above and according to the present invention, it is preferable that the outer case is made of metal and the core of the electromagnetic equipment is in face-contact with at least one of the inner surfaces of the outer case through an electrical insulating member.

A metallic outer case is durable and inexpensive and has a high heat-radiating efficiency. However, because the metallic outer case is very electrically conductive, it is necessary to interpose an electrical insulating member between the core of the electromagnetic equipment and the outer case.

It is preferable that the electrical insulating member has elasticity, because the core of the electromagnetic equipment can surely be in face-contacted with the inner surface of the outer case even if there is a large dimensional error.

If a large dimensional error is allowed, the manufacturing cost for a converter and a discharge-lamp operating apparatus using the converter can be decreased.

In the converter and the discharge-lamp operating apparatus using the converter both of which are constructed as mentioned above and according to the present invention, it is also preferable that the core of the electromagnetic equipment is made of ferrite and the electrical insulating member is an electrical insulating sheet arranged on the above described at least one of the inner surfaces of the outer case.

A core made of ferrite contributes to make the electromagnetic equipment compact because it increases the operating efficiency of electromagnetic equipment, and hence contributes to decrease the sizes of the converter according to the present invention and the discharge-lamp operating apparatus using the converter.

An electrical insulating sheet is thin and inexpensive, and it is easily installed on the inner surface of the outer case.

Further in the converter and the discharge-lamp operating apparatus using the converter both of which are constructed as mentioned above and according to the present invention, the opening formed on a part of the printed circuit board may be an opening the entire periphery of which is specified by the printed circuit board, an opening the periphery of which is notched at the side edge of the printed circuit board, on an opening defined by a space between several board pieces when the printed circuit board is composed by several board pieces.

Also in the converter and the discharge-lamp operating apparatus using the converter both of which are constructed as mentioned above and according to the present invention, it is preferable that the outer case includes at least a pair of case members having high thermal conductivity and being capable of producing a housing space opened at two portions by being combined with each other, a pair of terminal blocks having terminals are arranged on the two openings of the outer case, the printed circuit board is supported by the paired terminal blocks in the outer case, and the converter circuit or discharge-lamp operating circuit on the printed circuit board is electrically connected to each terminal on the paired terminal blocks.

By making the paired terminal blocks, having terminals for the circuits on the printed circuit board, support the printed circuit board, the natural oscillation length of the printed circuit board can further be shortened and beats generated in the printed circuit board by electromagnetic equipment during the converter is operating can further be suppressed.

Terminals of one of the paired terminal blocks can be connected to an electric power source so that they are used for inputting the electric power to the discharge-lamp operating circuit on the printed circuit board and the terminals of the other of the paired terminal blocks can be connected to a discharge lamp so that they are used for outputting the electric power from the discharge-lamp operating circuit to the discharge lamp.

In this case, it is preferable to arrange the electromagnetic equipment at a position close to the output terminal block on the printed circuit board and the switching element at a position closer to the input terminal block than the electromagnetic equipment.

Above arrangement of the electromagnetic equipment and switching element on the printed circuit board makes the construction of the circuit on the printed circuit board more compact and hence promote the miniaturingation of the converter and the discharge-lamp operating apparatus using the converter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

Figure 1:
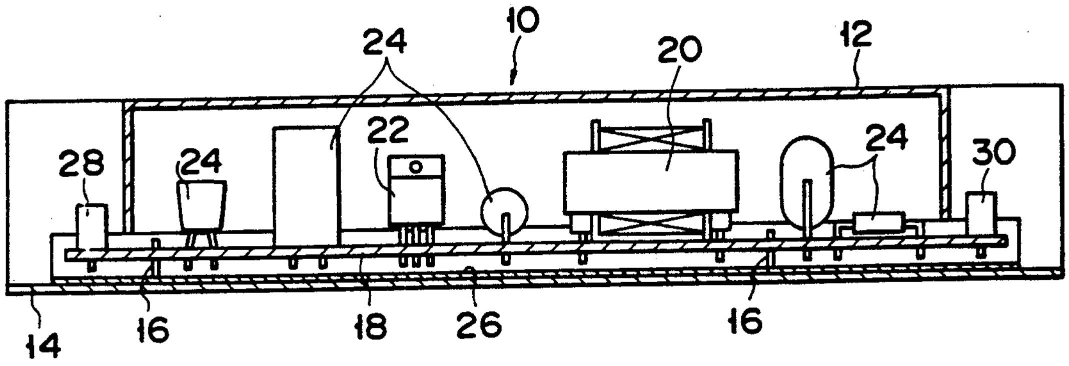
(PRIOR ART) FIG. 1
FIG. 1 is a schematic longitudinal sectional view of a conventional discharge-lamp operating apparatus, which uses a converter composed of such electromagnetic equipment having a core as a transformer and is used to operate such discharge-lamp as a fluorescent lamp.
Figure 2:
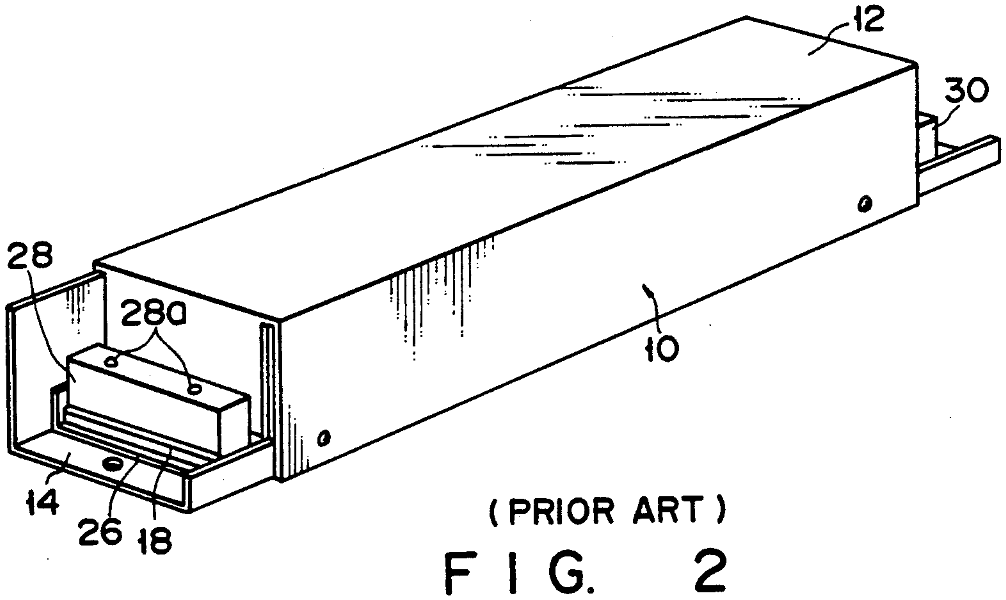
(PRIOR ART) FIG. 2
FIG. 2 is a schematic perspective view of the conventional discharge-lamp operating apparatus shown in FIG. 1.
Figure 3:
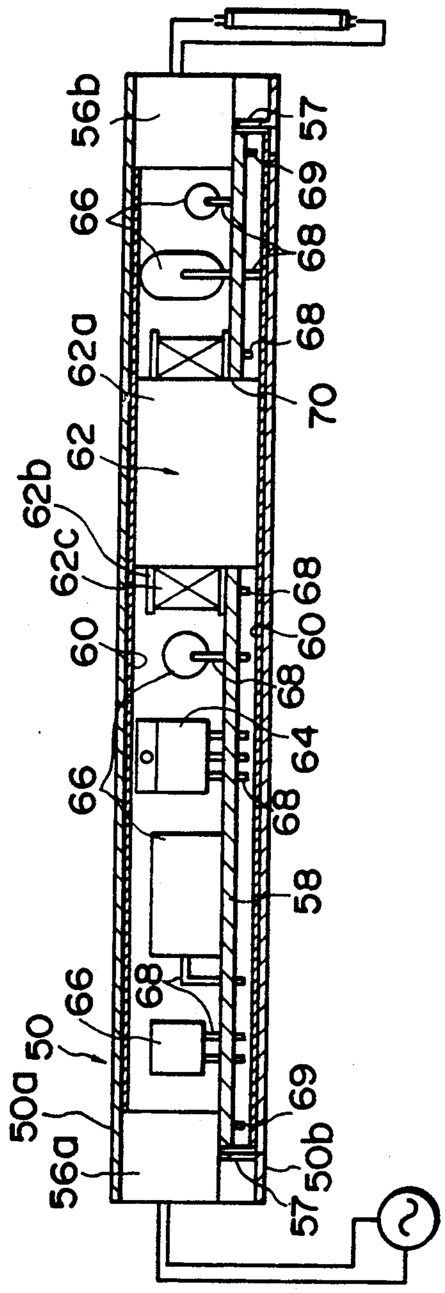
FIG. 3 is a schematic longitudinal sectional view of a discharge-lamp operating apparatus according to an embodiment of the present invention.
Figure 4:
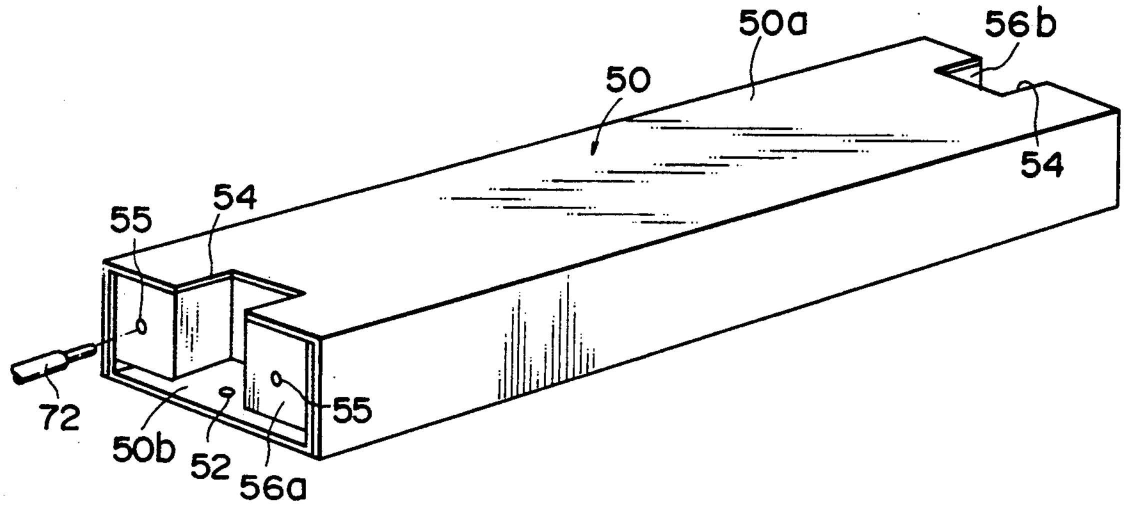
FIG. 4 is a schematic perspective view of the discharge-lamp operating apparatus in FIG. 3.

The various embodiments of the present invention will be described in detail in the followings with reference to FIGS. 3 through 11.

DETAILED DESCRIPTION OF THE PREFERRED EMBODIMENTS

FIGS. 3 through 8 schematically show the discharge-lamp operating apparatus according to an embodiment of the present invention.

This discharge-lamp operating apparatus is an electronic stabilizer used for a luminaire to operate, for example, a fluorescent lamp, and comprises a slender square-tubular outer case 50.

The outer case 50 is constructed by combining a metal upper case member **50*a* and a metal lower case member 50*b*, each of which has an angular approximately-U-shaped cross section, so that they can be separated, and longitudinal both ends of the outer case 50 open to the outside. At both end portions of a lower wall of the lower case member 50*b*, securing holes 52 are formed through which securing screws are passed to secure the lower case member 50*b* to a frame of a luminaire (not illustrated). At both end portions of an upper wall of the upper case member 50*a*, openings 54 are formed to easily set or remove these screws to and from the securing holes 52 at the both end portions of the lower wall of the lower case member 50*b***.

Plastic terminal blocks **56*a* and 56*b* having several terminals 55 are installed at the longitudinally ends of the outer case 50. A pair of terminal blocks 56*a* and 56*b* are secured to the lower wall through several supporting posts 57 which are cut out from the lower wall of the lower case member 50*b*** and bent inwardly.

An elongated printed circuit board 58 is housed in the outer case 50. Both end portions of the printed circuit board 58 are supported by the pair of terminal blocks **56*a* and 56*b* so that the printed circuit board 58** is separated from the lower wall to be substantially parallel therewith at a position close to the lower wall.

Electrically insulating paper 60 having elasticity is attached to the inner surface of the upper wall of the upper case member **50*a* and that of the lower wall of the lower case member 50*b***.

Predetermined wirings are printed on a lower surface of the printed circuit board 58. A transformer 62 as an electromagnetic equipment having a core, a switching element 64 (e.g. transistor) having a heat radiating plate, and other various electronic parts 66 are installed on an upper surface of the printed circuit board 58. Each of the transformer 62, the switching element 64 and the various electronic parts 66 has several lead pins 68 directed downwardly. These lead pins 68 are inserted into through-holes formed at several predetermined positions in the printed circuit board 58, and are soldered to several predetermined positions of the printed wirings on the lower surface of the printed circuit board 58, so that the printed wirings of the printed circuit board 58 construct a discharge-lamp operating circuit including a converter.

At the both end portions of the printed circuit board 58, through-holes are formed into which several lead pins 69 of the paired terminal blocks 56*a*, 56*b* are inserted. By inserting several lead pins 69 of the paired terminal blocks 56*a* and 56*b* into the through-holes and soldering them to predetermined positions of the printed wirings on the lower surface of the printed circuit board 58, the printed circuit board 58 is secured to the paired terminal blocks 56*a* and 56*b*, and the terminals 55 of the paired terminal blocks 56*a* and 56*b* are electrically connected to the discharge-lamp operating circuit of the printed circuit board 58.

Figure 5:
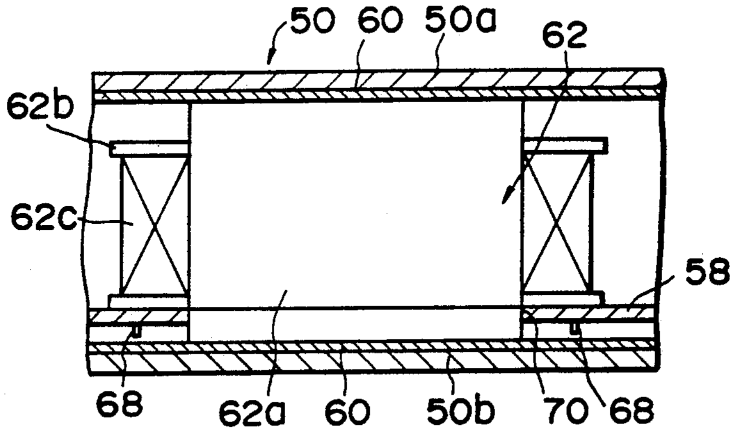
FIG. 5 is a schematic enlarged view of the transformer in FIG. 3 and its circumstance.

A core 62*a* of the transformer 62 is made of ferrite, and an opening 70 is formed at a position in the printed circuit board 58, corresponding to the core 62*a*, as especially clearly shown in FIG. 5. The core 62*a* is inserted into the opening 70 of the printed circuit board 58, and is protruded from the printed circuit board 58 upward and downward. Upper and lower end surfaces of the core 62*a* are closely in face-contact with the inner surface of the upper wall of the upper case member 50*a* and that of the lower wall of the lower case member 50*b* through the electrically insulating paper 60.

The coil bobbin 62*b* of the transformer 62 is horizontally placed on the upper surface of the printed circuit board 58, a coil 62*c* is horizontally held by the coil bobbin 62*b*, and several lead pins 68 of the transformer 62 are supported by the coil bobbin 62*b*.

Figure 6:
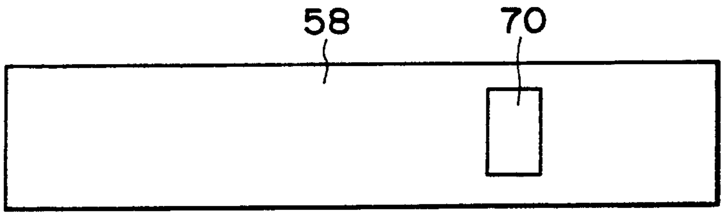
FIGS. 6 through 8 are schematic flat views showing various shapes of openings formed on a part of the printed circuit board of the discharge-lamp operating apparatus in FIG. 3 into which the core of the electromagnetic-equipment is inserted.
Figure 7:
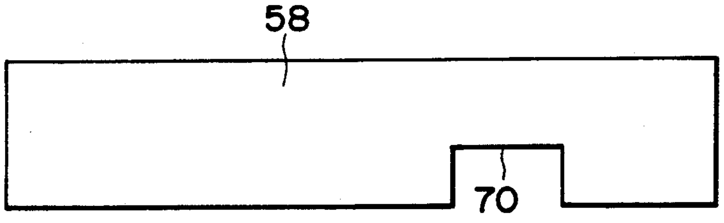
Figure 8:
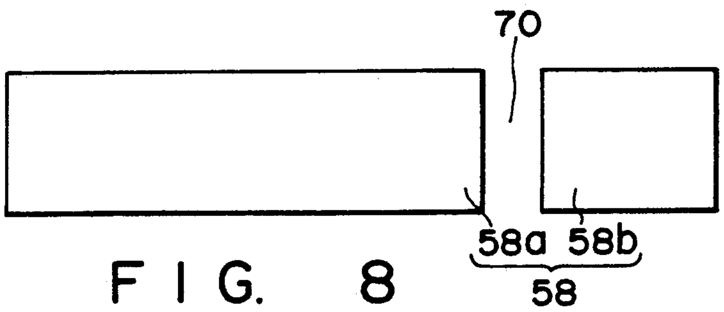

FIGS. 6 through 8 show various shapes of the opening 70 of the printed circuit board 58, into which the core 62*a* of the transformer 62 is inserted. The entire periphery of the opening 70 in FIG. 6 is defined by the printed circuit board 58. The opening 70 in FIG. 7 is notched at one side edge of the printed circuit board 58. The opening 70 in FIG. 8 is defined by a space between several board pieces 58*a* and 58*b* in a case that the printed circuit board 58 is composed of several board pieces 58*a*, 58*b*.

The discharge-lamp operating apparatus according to an embodiment constructed as mentioned above is secured to a frame of a luminaire (not illustrated), and then lead wires 72 extended from an electric power source (not illustrated) are inserted into and secured to the terminals 55 of one terminal block 56*a* which is farther distant from the transformer 62. Lead wires (not illustrated) extended from a fluorescent lamp are inserted into and secured to the terminals 55 of the other terminal block 56*b* closer to the transformer 62.

In the discharge-lamp operating apparatus according to an embodiment constructed as mentioned above, the heat generated from the transformer 62 during the operation of the apparatus is transmitted from the core 62*a* of the transformer 62 to the upper case member 50*a* and the lower case member 50*b* of the outer case 50 through the electrically insulating paper 60, and quickly radiated from the outer case 50 having a high heat-radiating characteristic and large heat radiating area. Therefore, the temperature rise in the outer case 50 is 5° to 15° lower than that of a conventional discharge-lamp operating apparatus with the same performance.

As the result, the transformer 62 with a heat capacity smaller than ever (that is, more compact one) can be used and the discharge-lamp operating apparatus can be made compact.

Moreover, since there is no gap between the transformer 62 which is the largest member in the discharge-lamp operating circuit and the upper case member 50*a* and lower case member 50*b* of the outer case 50, it is possible to decrease the height of the outer case 50 compared with a conventional one, and therefore make the discharge-lamp operating apparatus more compact.

The electrically insulating paper 60 interposed between the transformer 62 and the upper and lower case members 50*a*, 50*b* of the outer case 50 prevents a gap from being produced between the upper and lower case members 50*a*, 50*b* of the outer case 50 due to variation of dimensional accuracy of the components of the discharge-lamp operating apparatus, and also prevents the transformer 62 from insufficiently contacting the upper and lower case members 50*a*, 50*b* due to the above variation.

The above described gap and insufficient contact cause not only the heat transmission efficiency from the transformer 62 to the outer case 50 to decrease but also supporting of the printed circuit board 58 to the outer case 50 through the transformer 62 to be unstable.

In this embodiment, the natural oscillation length of the printed circuit board 58 is smaller than that of the conventional on because the printed circuit board 58 is supported by the outer case 50 through the paired terminal blocks 56*a* and 56*b* and also the relatively large area at the middle portion of the printed circuit board 58 is supported by the outer case 50 through the transformer 62. Therefore, it is effectively prevented that the printed circuit board 58 generates beats due to the vibration generated from the transformer 62 while the discharge-lamp operating apparatus operates.

Because the electrically insulating paper 60 interposed between the transformer 62 and the upper and lower case members 50*a*, 50*b* of the outer case 50 has an elasticity, it effectively prevents various components in the outer case 50 from being damaged by an external force applied to the outer surface of the outer case 50.

Instead of the elastic electrically insulating paper 60, a rubber sheet or prepreg sheet can be used.

The electrically insulating paper 60 compensates that the electrically insulating space between various electronic parts 66 including the wirings and switching element 64 on the printed circuit board 58 and the outer case 50 becomes smaller.

If the problems including compensation of the insulating space and sufficient contact between the transformer 62 and the outer case 50 due to the variation of dimensional accuracy are solved, the electrically insulating paper 60 and the various electrically insulating members used instead of the paper 60 can be omitted.

If only the problem of insufficient contact due to the variation of dimensional accuracy is solved, electrically insulating paint can be used instead of the electrically insulating paper 60.

Though electromagnetic equipment having a core is the transformer 62 in the above described embodiment, it may also be a choke. The core of the transformer 62 can use not only ferrite but also laminated core and amorphous core.

Figure 9:
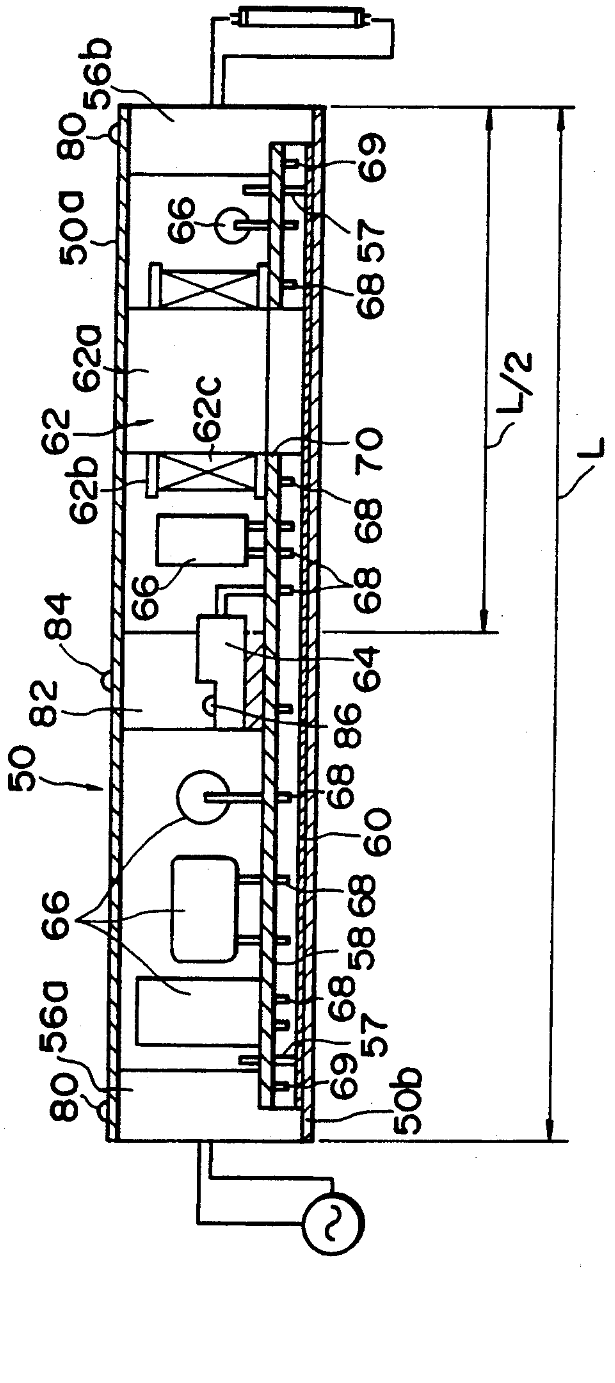
FIG. 9 is a schematic longitudinal sectional view of a discharge-lamp operating apparatus according to another embodiment of the present invention.
Figure 10:
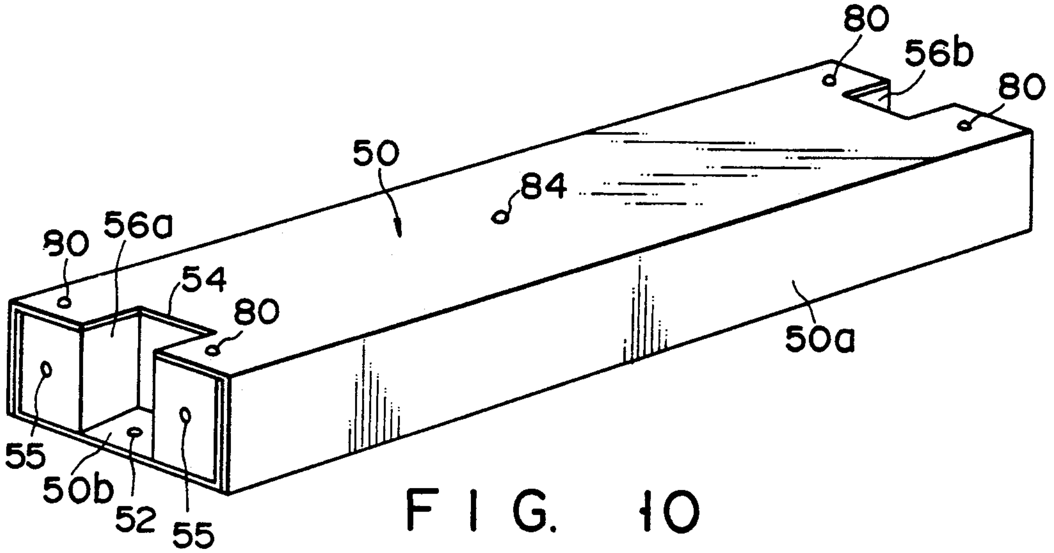
FIG. 10 is a schematic perspective view of the discharge-lamp operating apparatus in FIG. 9.
Figure 11:
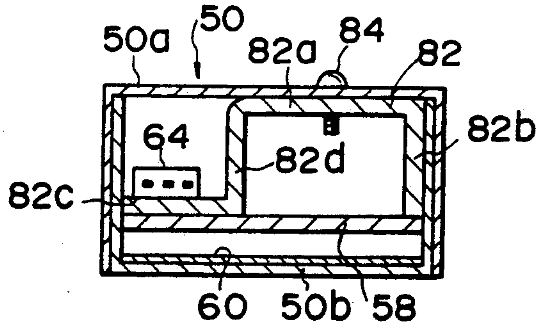
FIG. 11 is a schematic cross sectional view of the discharge-lamp operating apparatus in FIG. 9 at a switching element with a heat radiating plate.

The following is the description of another embodiment of the present invention with reference to FIGS. 9 through 11.

In the latter embodiment, same reference numerals are used for the same members as those in the former embodiment in FIGS. 3 through 8 and detailed descriptions of these members are omitted.

In another embodiment, the upper wall of the upper case member 50*a* is removably secured by well known securing means 80 such as screws to the paired terminal blocks 56*a* and 56*b* installed in the openings at the both end portions of the outer case 50.

The paired terminal blocks 56*a* and 56*b* are secured to the lower case member 50*b* with well known securing means (not illustrated). The printed circuit board 58 whose both end portions are supported by the paired terminal blocks 56*a* and 56*b* is further supported at its both end portions by several supporting posts 57 which are cutted out from the lower wall of the lower case member 50*b* and bent inwardly.

In this embodiment, a heat radiating plate 82 of the switching element 64 is removably secured to the upper wall of the upper case member 50*a* of the outer case 50 with a screw 84 as especially clearly shown in FIG. 11. The heat radiating plate 82 is made of aluminum, and has a horizontal upper surface portion 82*a* being in face-contact with the inner surface of the upper wall of the upper case member 50*a*, a vertical side surface portion 82*b* extending downward from the horizontal upper surface position 82*a* and face-contacting the inner surface of one side wall of the lower case member 50*b*, the horizontal lower surface portion 82*c* extending along the upper surface of the printed circuit board 58 and having the switching element 64 secured by well known securing means 86 (FIG. 9) such as a screw, and a vertical connecting portion 82*d* extending downward from the horizontal upper surface portion 82*a* and connected to the horizontal lower surface portion 82*c*.

Further in this embodiment, the opening 70, formed in the printed circuit board 58, into which the core 62*a* of the transformer 62 is inserted, is located within the range of ½ the longitudinal length L of the outer case 50 from the output terminal block 56*b*. The switching element 64 is located at a position farther from the output terminal block 56*b* than the transformer 62 on the printed circuit board 58 (that is, closer to the input terminal block 56*a* than the transformer 62) so that it will not be affected by the heat generated in the transformer 62 during the operation of the discharge-lamp operating apparatus.

In the latter embodiment, because the printed circuit board 58 is secured to the outer case 50 not only by the paired terminal blocks 56*a*, 56*b* and the transformer 62 but also by the heat radiating plate 82 of the switching element 64, the natural oscillation length of the printed circuit board 58 is smaller than that in the previously-mentioned embodiment.

Therefore, in this embodiment, it is possible to more effectively suppress beats generated in the printed circuit board 58 generated from the vibration produced in the transformer 62 while the discharge-lamp operating apparatus operates.

It is also possible to more effectively radiate the heat produced in the switching element 64 during the operation of the discharge-lamp operating apparatus into the external space from the outer case 50 through the heat radiating plate 82.

Therefore, the switching element 64 and the other various electronic parts 66 can be substituted by those with smaller heat capacity (that is, by more compact ones), decreasing the sizes and prices of the discharge-lamp operating apparatus and a luminaire using the discharge-lamp operating apparatus.

The paired plastic terminal blocks 56*a* and 56*b* are secured to the both end portions of the upper and lower case members 50*a*, 50*b* of the outer case 50 so that they directly contact the both end portions. Therefore, it is possible to effectively prevent the both end portions of the upper and lower case members 50*a*, 50*b* which tends to be vibrated from being vibrated.

The heat generated in the switching element 64 can further be decreased by using an FET (Field Effect Transistor) for the transistor of the switching element 64.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A converter comprising:

an outer case having high thermal conductivity; and a printed circuit board which is housed in the outer case and is provided with a converter circuit including an electromagnetic equipment having a core, and a part of which having an opening into which the electromagnetic equipment is inserted, the core of the electromagnetic equipment inserted into the opening being in face-contact with at least one of inner surfaces of the outer case.

2. A converter according to claim 1, wherein the core of said electromagnetic equipment is in face-contact with two facing portions of the inner surfaces of said outer case, which are facing to each other.

3. A converter according to claim 1, wherein said outer case is made of metal, and the core of said electromagnetic equipment is in face-contact with at least one of the inner surfaces of said outer case through an electrical insulator.

4. A converter according to claim 3, wherein the core of said electromagnetic equipment is made of ferrite, and said electrical insulator is an electrically insulating sheet arranged on the inner surfaces of said outer case.

5. A converter according to claim 1, wherein said outer case includes at least a pair of case members which are mutually combined to produce a housing space opened at two positions, and have high thermal conductivity, a pair of terminal blocks having terminals are arranged at two openings of said outer case, said printed circuit board is supported by the terminal blocks in said outer case, and the converter circuit of said printed circuit board is electrically connected to the terminals of said terminal blocks.

6. A converter according to claim 5, wherein the core of said electromagnetic equipment is in face-contact with two facing portions of the inner surfaces of said outer case, which are facing to each other.

7. A converter according to claim 5, wherein said outer case is made of metal, and the core of said electromagnetic equipment is in face-contact with at least one of the inner surfaces of said case through an electrical insulator.

8. A converter according to claim 5, wherein the core of said electromagnetic equipment is made of ferrite, and said electrical insulator is an electrically insulating sheet arranged on the inner surfaces of said outer case.

9. A discharge-lamp operating apparatus used for operating a discharge lamp, comprising:

an outer case which has high thermal conductivity; and a printed circuit board which is housed in the outer case and is provided with a discharge-lamp operating circuit including an electromagnetic equipment with a core and a switching element, and a part of which an opening into which having the electromagnetic equipment is inserted, the electromagnetic equipment being attached to the printed circuit board, and the switching element being arranged on the printed circuit board with it being separated from the electromagnetic equipment so that it is prevented from being influenced by heat generated from the electromagnetic equipment and having a heat radiating member being in face-contact with at least one of the inner surfaces of the outer case.

10. A discharge-lamp operating apparatus according to claim 9, wherein said outer case is made of metal, and the core of said electromagnetic equipment is in face-contact with at least one of the inner surfaces of said outer case through an electrical insulator.

11. A discharge-lamp operating apparatus according to claim 10, wherein the core of said electromagnetic equipment is made of ferrite, and said electrical insulator is an electrically insulating sheet arranged on the inner surfaces of said outer case.

12. A discharge-lamp operating apparatus according to claim 9, wherein said outer case includes at least a pair of case members which are mutually combined to produce a slender housing space opened at its both ends, a pair of terminal blocks having terminals are arranged at two openings of said outer case, said printed circuit board is supported by the terminal blocks, and the discharge-lamp operating circuit on said printed circuit board is electrically connected to the terminals of the terminal blocks.

13. A discharge-lamp operating apparatus according to claim 12, wherein the terminals of one of said one terminal blocks are connected to a power source so that it will be used for the inputting power from the power source to said discharge-lamp operating circuit of said printed circuit board, and the terminals of the other of said terminal blocks are connected to a discharge lamp so that it will be used for outputting power from said discharge-lamp operating circuit of said printed circuit board to the discharge lamp.

14. A discharge-lamp operating apparatus according to claim 13, wherein said electromagnetic equipment is arranged at a position close to the output terminal block on said printed circuit board, and said switching element is arranged at a position closer to the input terminal block than said electromagnetic equipment.

15. A discharge-lamp operating apparatus according to claim 14, wherein the core of said electromagnetic equipment is in face-contact with two facing portions of the inner surfaces of said outer case, which are facing each other.

16. A discharge-lamp operating apparatus according to claim 14, wherein said outer case is made of metal, and the core of said electromagnetic equipment is in face-contact with at least one of the inner surfaces of said outer case through the electrical insulator.

17. A discharge-lamp operating apparatus according to claim 16, wherein the core of said electromagnetic equipment is made of ferrite, and said electrical insulator is an electrically insulating sheet arranged on the inner surfaces of said case.

* * * * *

UNITED STATES PATENT AND TRADEMARK OFFICE
CERTIFICATE OF CORRECTION

PATENT NO. : 5,107,186

DATED : April 21, 1992

INVENTOR(S) : IHARA, Akihiko

It is certified that error appears in the above-identified patent and that said Letters Patent is hereby corrected as shown below:

Title page, Item [73] Assignee, change:

"Olympus Optical Co., Ltd." to --Tokyo Electric Co., Ltd.--.

Signed and Sealed this

Twenty-fourth Day of October, 1995

Attest:

BRUCE LEHMAN

Attesting Officer

Commissioner of Patents and Trademarks